US011143759B2

(12) United States Patent
Stevenson et al.

(10) Patent No.: US 11,143,759 B2
(45) Date of Patent: Oct. 12, 2021

(54) INVESTIGATION SYSTEM AND METHOD (71) Applicant: Kabushiki Kaisha Toshiba, Minato-ku (JP)

(72) Inventors: Richard Mark Stevenson, Cambridge (GB); Jan Huwer, Cambridge (GB); Andrew James Shields, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/678,302

(22) Filed: Nov. 8, 2019

(65) Prior Publication Data

US 2020/0150272 A1    May 14, 2020

(30) Foreign Application Priority Data

Nov. 9, 2018    (GB) ...................... 1818310

(51) Int. Cl.
*G01S 17/10* (2020.01)
*G01S 7/486* (2020.01)
*G01S 7/487* (2006.01)
*G01S 7/499* (2006.01)
*G01S 17/26* (2020.01)
*G01S 7/4863* (2020.01)

(52) U.S. Cl.
CPC ............. *G01S 17/26* (2020.01); *G01S 7/487* (2013.01); *G01S 7/4863* (2013.01); *G01S 7/499* (2013.01)

(58) Field of Classification Search
CPC ........ G01S 17/26; G01S 7/4863; G01S 7/487; G01S 7/499
See application file for complete search history.

(56) References Cited

U.S. PATENT DOCUMENTS

2016/0327646 A1   11/2016   Scheim et al.
2017/0184450 A1    6/2017   Doylend et al.
2018/0081041 A1*   3/2018   Niclass ................. G01S 7/4863
(Continued)

FOREIGN PATENT DOCUMENTS

CN    108594256 A    9/2018
GB      2537821 B    4/2017
(Continued)

OTHER PUBLICATIONS

Hocheol Shin, et al., "Illusion and Dazzle: Adversarial Optical Channel Exploits Against Lidars for Automotive Applications", In. Fischer W., Homma N. (eds) Cryptographic Hardware and Embedded Systems—CHES 2017. Lecture Notes in Computer Science, vol. 10529.—https://link.springer.com/chapter/10.1007/978-3-319-66787-4_22, 21 pages.

(Continued)

*Primary Examiner* — Jamil Ahmed
(74) *Attorney, Agent, or Firm* — Oblon, McClelland, Maier & Neustadt, L.L.P.

(57) ABSTRACT

An investigative system, comprising:
  an emitter, said emitter being adapted to output a plurality of pulses, said plurality of pulses being arranged in a first temporal pattern;
  a receiver adapted to receive said plurality of pulses; and
  a correlator adapted to correlate the first pattern with the received plurality of pulses to output a correlated pattern.

20 Claims, 8 Drawing Sheets

(56) References Cited

U.S. PATENT DOCUMENTS

2018/0188358 A1    7/2018  Li et al.
2018/0284277 A1    10/2018 Lachapelle et al.
2019/0011558 A1*   1/2019  Crouch .................. G01S 17/26

FOREIGN PATENT DOCUMENTS

| JP | 5-164836 A | 6/1993 |
| JP | 2014-81254 A | 5/2014 |
| WO | WO 2018/125823 A1 | 7/2018 |

OTHER PUBLICATIONS

Japanese Office Action dated Jan. 19, 2021 in Japanese Patent Application No. 2019-199901 (with English translation), 14 pages.
Office Action dated Aug. 24, 2021 in corresponding Japanese Application No. 2019-199901, along with an English translation.

* cited by examiner

INVESTIGATION SYSTEM AND METHOD

CROSS-REFERENCE TO RELATED APPLICATIONS

This application is based upon and claims the benefit of priority from prior United Kingdom Application number GB1818310.3 filed on 9 Nov. 2018, the entire contents of which are incorporated herein by reference.

FIELD

Embodiments described herein relate to investigative systems and methods.

BACKGROUND

Investigative systems such as those that can perform time of flight ranging and 3D scanning are much in demand. LIDAR is one examples of a system that is used in surveying to measure the time that a pulse takes to reach a target.

It can be applied to many different tasks and can be used to perform 3D scanning. The technology can be applied to both static and non-static problems. For example, LIDAR can be used in the control of autonomous vehicles.

BRIEF DESCRIPTION

DETAILED DESCRIPTION

In an embodiment, an investigative system is provided, comprising:
an emitter, said emitter being adapted to output a plurality of pulses, said plurality of pulses being arranged in a first temporal pattern;
a receiver adapted to receive said plurality of pulses; and
a correlator adapted to correlate the first pattern with the received plurality of pulses to output a correlated pattern.

The above embodiment can be used for LIDAR. In known LIDAR a light pulse is reflected off an object and detected to determine the distance of the object via a time of flight measurement.

In the above embodiment, a LIDAR pulse is divided into a plurality of pulses. These plurality of pulses have a pattern. The pattern is designed such that correlation of the first pattern with the received plurality of pulses will allow a time of flight to be extracted.

As will be explained later, by using the above method, it is possible to extract a signal (plurality of pulses) in the situation where the noise is of the same magnitude or larger than the signal.

In an embodiment, the receiver is a triggered receiver, for example where an input photon triggers an avalanche. For example the receiver can be capable of operating in Geiger mode. The receiver may be a single photon avalanche detector.

In an embodiment, the first temporal pattern is selected to avoid repeating cycles within the first pattern. In a further embodiment, a candidate first temporal pattern is generated, this pattern is then autocorrelated, the candidate pattern is selected as the first temporal pattern if the autocorrelated pattern is dominated by a single peak.

In an embodiment, the emitter and receiver are arranged such that the receiver detects pulses that are reflected from an object, the correlator being adapted to extract the time of flight of the plurality of pulses from the correlated pattern.

As described above, the system is configured as a LIDAR system by using the time of flight to determine the position of the object.

The system may further comprise a mechanism to steer the plurality of pulses to allow an object to be spatially scanned. The system may comprise an array of emitters each configured to emit a plurality of pulses with different temporal patterns, the correlator being adapted to correlate each of the different patterns with the received plurality of pulses. The different temporal patterns should be selected to avoid correlation with each other.

In all of the above embodiments, the width of each pulse of the plurality of pulses may be between 10-1000 ps. The minimum separation between pulses can also be between 10-1000 ps.

The correlator may be adapted to correlate the first pattern with the received plurality of pulses using a digital phase correlation. For example, a correlation of the type:

$$C = F^{-1}\left\{\frac{s \cdot r^*}{|s \cdot r^*|}\right\}$$

Where, C is the output correlation, s and r are the Fourier transforms of the first patter and received pulse patterns respectively, $F^{-1}$ is the inverse Fourier transform function, and [·] is the Hadamard product operator.

In an embodiment, the first temporal pattern is varied over time. In a further embodiment, the system is adapted to make plurality of investigations, wherein the emitter emits a plurality of pulses for each investigation, the first temporal pattern changing for each investigation.

The emitter and the receiver are mounted on a mechanical movable platform. In a further embodiment, the system comprises a moveable reflector, wherein said reflector is positioned to direct the plurality of pulses to an object and direct pulses reflected from the object to the receiver, the reflector being moveable to allow the object to be scanned.

In a further embodiment the emitter is adapted to emit a wide beam, the receiver comprising an array of receivers. For example, a point beam is subjected to beam broadening via a lens or the like to irradiate an area of the scene as opposed to a point.

In a further embodiment, the emitter is a directable emitter and the receiver is adapted to receive signals from a wide area.

The system may also be used with a layer of quantum security. Here, the system will further comprise an encoder, said encoder being adapted to encode said plurality of pulses with quantum information, the system further comprising a decoder adapted to decode said quantum information.

In the above, the correlator may be adapted to determine the time of flight of said pulses from said correlation measurement, the system being further adapted to identify the pulses for decoding using the time of flight. The encoder may be adapted to encode quantum information on said pulses by encoding said pulses using polarisation or phase.

The above quantum arrangement can be used to implement a quantum secure communication, using for example, BB84, B92 etc, independent of operation as a LIDAR system. In an embodiment, to identify the pulses to be decoded, the time of flight measurement will be used. Thus, in a further embodiment a quantum communication system is provided. Such a system can operate in both transmission and reflection arrangements.

In a further embodiment, a method of investigating a scene is provided, the method comprising:

emitting a plurality of pulses, said plurality of pulses being arranged in a first temporal pattern;
receiving said plurality of pulses; and
correlating the first pattern with the received plurality of pulses to output a correlated pattern.

Figure 1:
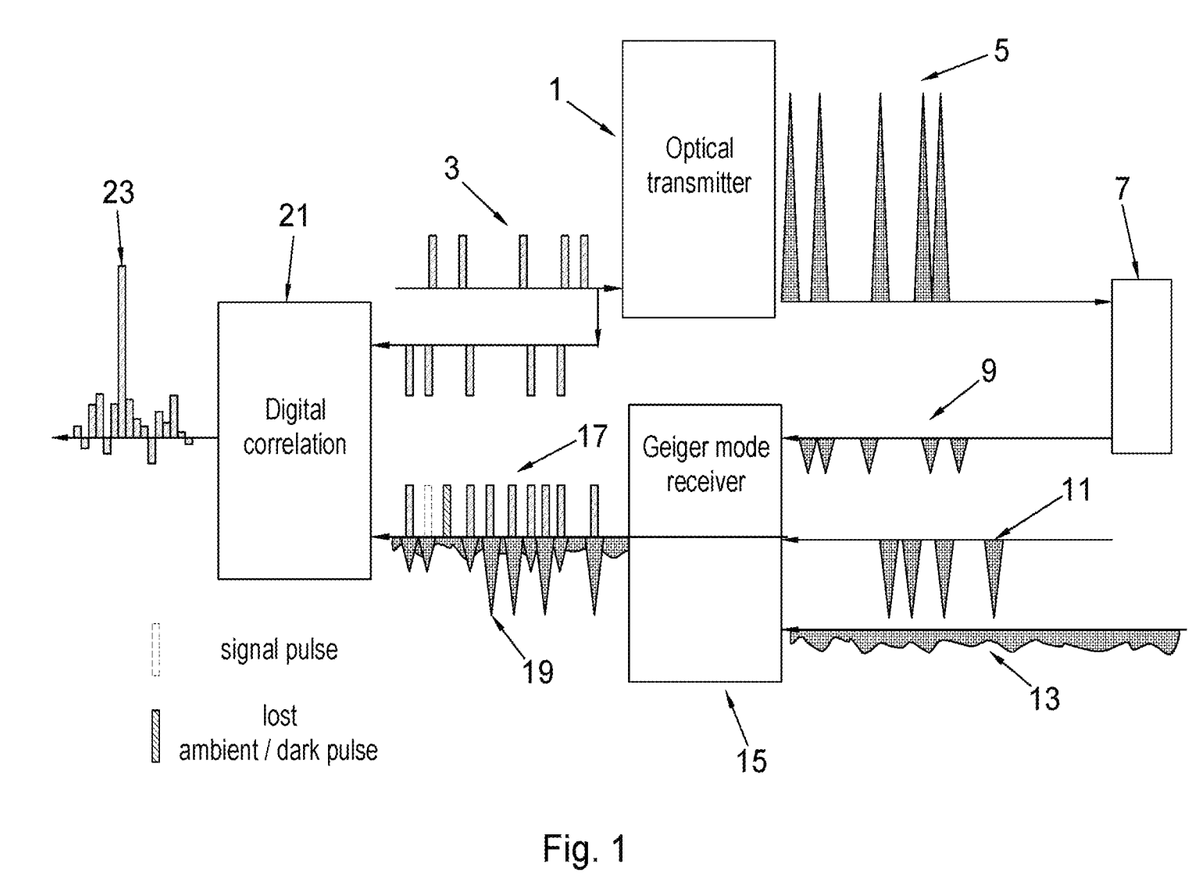
FIG. 1 is a schematic of a system in accordance with an embodiment.

An overview of the system in shown in FIG. 1. The system comprises an optical transmitter 1 that is positioned to reflect light of an object 7 and into a receiver 15.

This system is configured for reflection measurements, but the system may also be used for transmission measurements as will be described later.

In the system as shown in FIG. 1, a digital input pattern 3 as a function of time is generated. In an embodiment the pattern is designed to be free of periodic signals and can be considered to be random in this respect. In an embodiment, the generated pattern is selected such that autocorrelation of the pattern is tested and if the autocorrelated output is not dominated by a peak at zero, then the pattern is rejected.

The presences of other strong peaks in the autocorrelated signal suggest the presence of periodic features in the pattern. Also, in an embodiment, the pattern is selected to avoid correlation with other systems that will be emitting patterns of pulses.

The pattern of pulses 3 are used as an input to optical transmitter 1 to switch the output of the optical transmitter 1. The optical transmitter 1 is for example a laser emitting at 1550 nm with time averaged power within eye-safe limits.

The output 5 from the optical transmitter is a signal pattern consisting of a time series of optical pulses. The width of each optical pulse should be small to improve accuracy, in the region of 10-1000 ps. In an embodiment, the period, corresponding to the minimum separation between pulses, is of the order of ins, equivalent to a repetition frequency of 1 GHz.

In this embodiment, the output pattern is directed towards an object 7 or scene, and a reflected signal 9 returns toward the receiver 15. The signal power of the reflected output signal is attenuated by air and divergence of the scattered beam. Also, other light may reach the receiver 15, for example from other transmitters 11 and ambient light 13 such as sunlight to form a combined received signal 19.

In an embodiment, the receiver 15 operates in Geiger mode. In an embodiment the receiver is an InGaAs avalanche photodiode biased above the breakdown voltage. The receiver generates a 'click' or positive output when a photon or photons are detected. A digital output pattern 17 is the time series of these 'clicks' and includes contributions from the reflected signal 9, other signals 11 and ambient light 13. No noise is filtered out at this stage. Some photons are lost due to the non-perfect detection efficiency of the apparatus, or attenuation, as shown by the dashed pulse. Some extra pulses are added due to ambient light and/or dark counts, for example from unwanted spontaneous avalanches in an APD.

A digital correlation apparatus 21 then performs signal processing on the digital input pattern 3 and digital output pattern 17 to produce the correlation amplitude as a function of time delay 23. Identification of the maximum of the correlation data identifies the time of flight of the signal pattern, from which the distance to the object 7 can be calculated.

The above system can be operated as a digital LIDAR system.

Figure 2A:
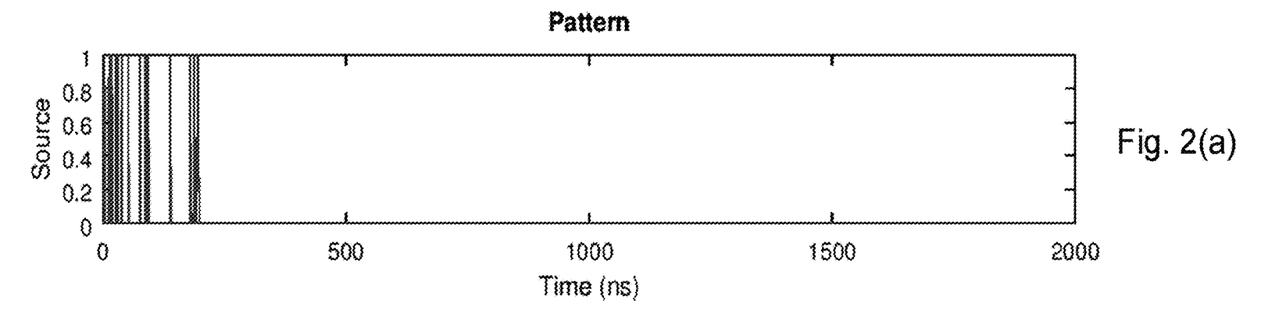
FIGS. 2(a) to 2(c) show stages in the operation of the system demonstrating the principles of the embodiment of FIG. 1.
Figure 2B:
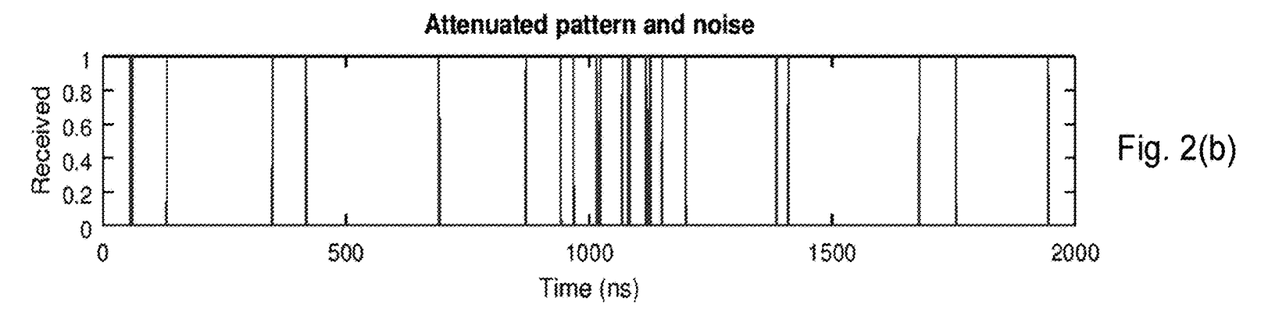
Figure 2C:
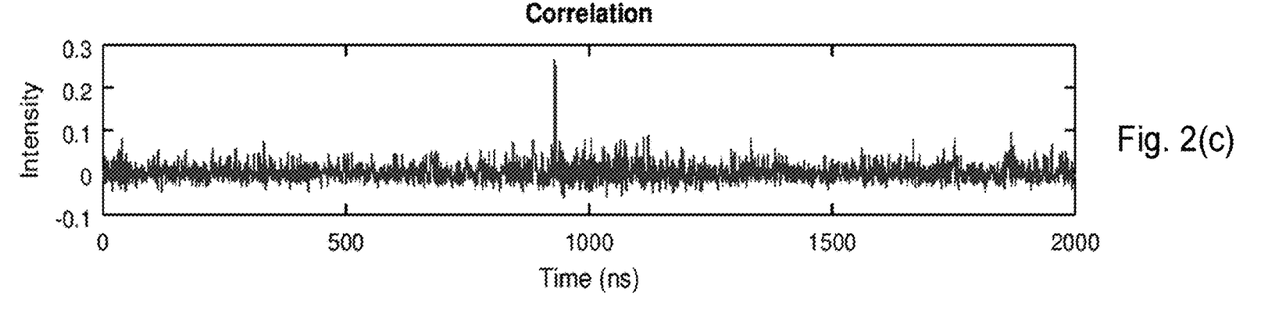

FIGS. 2(a) to 2(c) show stages in the operation of the system demonstrating the principles of the embodiment of FIG. 1.

FIG. 2(a) shows a digital input pattern that is randomly generated containing 20 pulses across a 200 period time window. The timebase is set to ins per pulse.

FIG. 2(b) shows a simulation of the output pattern as detected by a Geiger mode receiver. A time delay of the signal pattern was set at 930 ps, and loss is added such that the probability that the detector will fire is 0.5. This value is realistic for a state of the art APD with input flux of just 1 photon, and means only ~10 of the 20 signal pulses are detected. Next, random noise is added which could be from other emitters, ambient light, or dark counts. The noise count probability is set to 0.01/ns. This is much higher than typical detector dark count rates and means that through the course of the 2000 ns calculation on average 20 noise counts are detected, exceeding those from the signal by a factor of 2.

FIG. 2(c) shows the correlation of the simulated signal (FIG. 2(a)) and digital output (FIG. 2(b)) patterns are correlated. Many techniques can be used. In this example a phase correlation procedure is used such that;

$$C = F^{-1}\left\{\frac{s \cdot r^*}{|s \cdot r^*|}\right\}$$

Where, C is the output correlation, s and r are the Fourier transforms of the source and received patterns respectively, $F^{-1}$ is the inverse Fourier transform function, and [·] is the Hadamard product operator.

A clear peak is seen in the correlation shown in FIG. 2(c) at the correct delay of 930 ns, which shows that the time of flight to an object can be identified even for weak received signals and in the presence of strong noise.

Figure 3A:
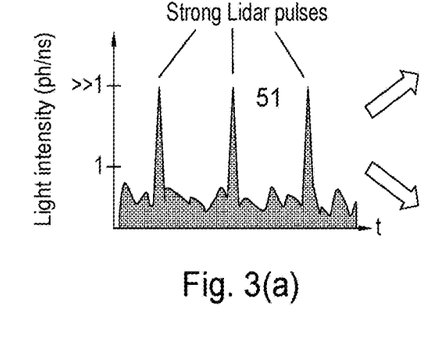
FIG. 3(a) is a plot of light intensity against time for a combined signal with strong signal pulses.

FIG. 3(a) is a plot of light intensity against time for a combined signal. Here, there is a strong emitter signal in the form of strong LIDAR pulses 51. The receiver in the embodiment of FIG. 1 is operated in Geiger mode as opposed to linear mode.

Figure 3B:
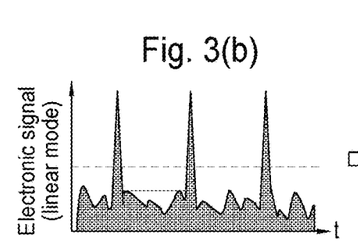
FIG. 3(b) shows the combined signal of FIG. 3(a) processed in linear mode.
Figure 3C:
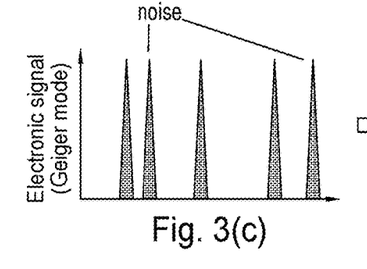
FIG. 3(c) shows the combined signal of FIG. 3(a) processed in Geiger mode.
Figure 3D:
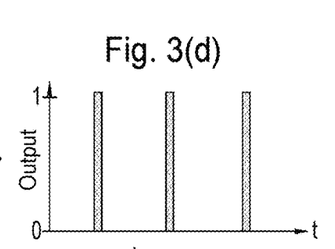
FIG. 3(d) shows the output of the processing of FIG. 3(b)
Figure 3E:
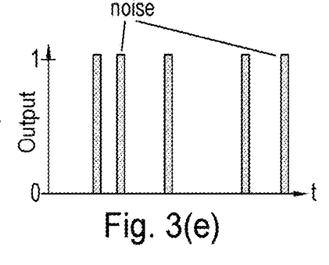
FIG. 3(e) shows the output of the processing of FIG. 3(c)

The advantages of a receiver operating in Geiger mode as opposed to operating in linear mode will be explained with reference to FIGS. 3(a) to 3(j). For strong received LIDAR pulses 51, for example from a nearby object, linear mode detection as shown in FIG. 3(b) is able to distinguish between signal and noise by setting the discriminator level (dashed line) appropriately, to create an output that is substantially noise free. In Geiger mode as shown in FIG. 3(c) under similar optical conditions, additional noise is carried onto the output due to finite probability of the detector firing due to weaker ambient light or dark counts. The output from the linear mode measurement of FIG. 3(b) is shown in FIG. 3(d) where the signals above the threshold are shown as output pulses. FIG. 3(e) shows the output from the Geiger mode measurement of FIG. 3(c). It should be noted that although unlike the case of 3(d), there is noise (as labelled) on the output signal from the receiver. However, in this scheme the noise is eliminated at a later point of the system, during digital correlation.

Figure 3F:
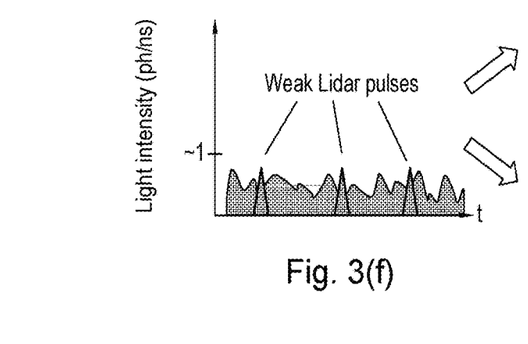
FIG. 3(f) is a plot of light intensity against time for a combined signal with weak signal pulses.
Figure 3G:
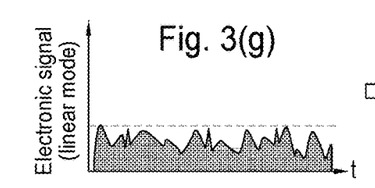
FIG. 3(g) shows the combined signal of FIG. 3(f) processed in linear mode.
Figure 3H:
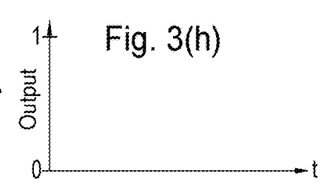
FIG. 3(h) shows the output of the processing of FIG. 3(g)
Figure 3I:
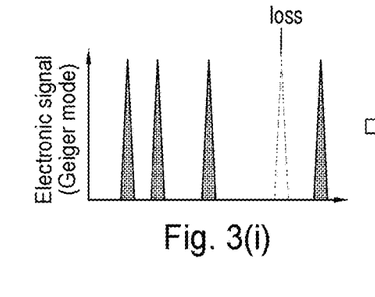
FIG. 3(i) shows the combined signal of FIG. 3(f) processed in Geiger mode.
Figure 3J:
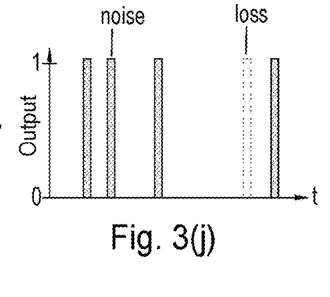
FIG. 3(j) shows the output of the processing of FIG. 3(i)

For weak received LIDAR pulses, for example, the signal shown in FIG. 3(f), the LIDAR signal intensity is similar to the ambient level. A conventional linear mode detector, for example that operates with a threshold a shown in FIG. 3(g) can no longer differentiate between signal and noise levels, and there is no output as illustrated in FIG. 3(h). For Geiger mode as shown in FIG. 3(i), there is still a finite probability that the detector will fire when a single photon is received, and the sensitivity is much greater due to the large gain from the avalanche when operating in Geiger mode. Therefore some of the signal pulses are detected with some noise as shown in FIG. 3(j) to create an output suitable for correlation and analysis.

Figure 4:
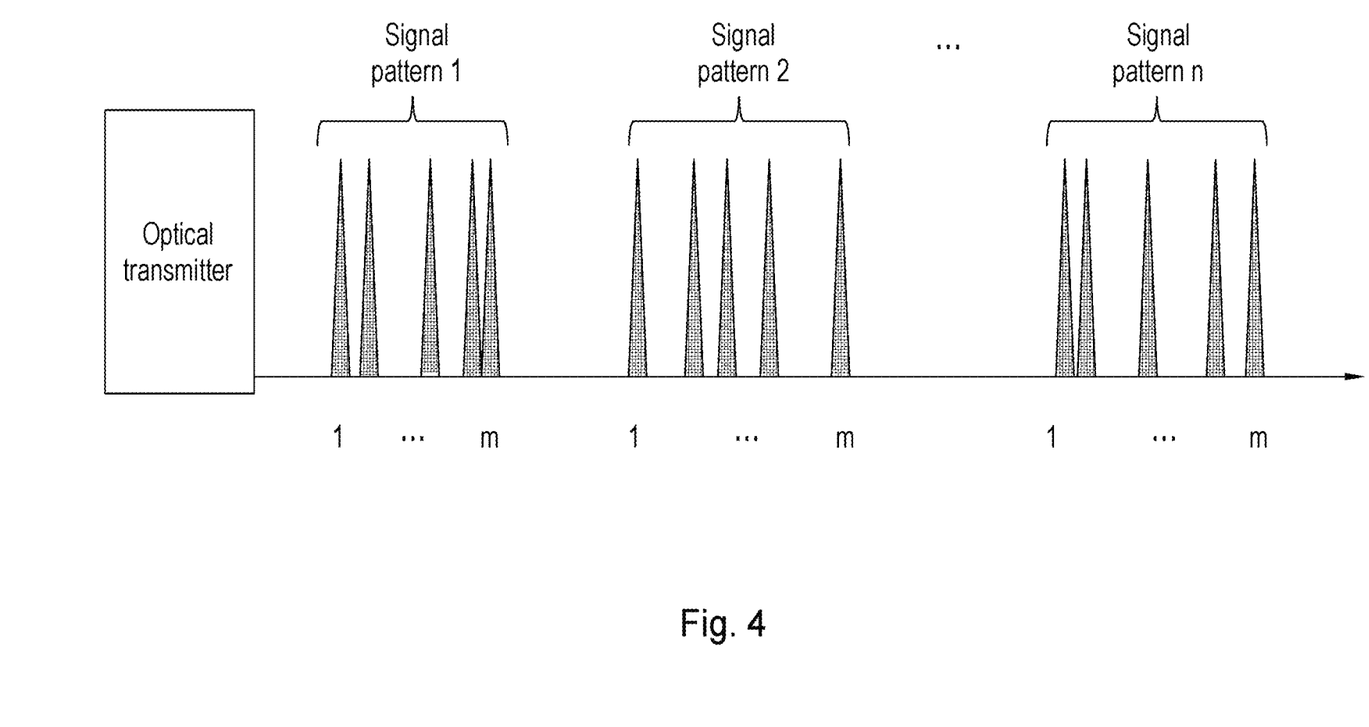
FIG. 4 shows a plot of a plurality of varying temporal patterns.

FIG. 4 illustrates how the random signal pattern may be refreshed for each cycle. This improves security since a hacker wishing to spoof a reflected LIDAR signal will not know the pattern in advance. It also can reduce interference between cycles, for example the system need not wait until the time corresponding to the maximum range is reached to emit subsequent pulses.

FIG. 4 shows an output where there a plurality of distinct pulse patterns. However, it is also possible for there to be a continually changing pattern. If the pattern is continuous then the correlation stage must be adjusted for optimum performance. For example, a subset of the signal pattern may be input into digital correlator so that the reflected signal is within the range recorded by the receiver.

FIGS. 5(a) to 5(d) show variation of how the emitter and receiver may be directed toward different parts of a scene.

Figure 5A:
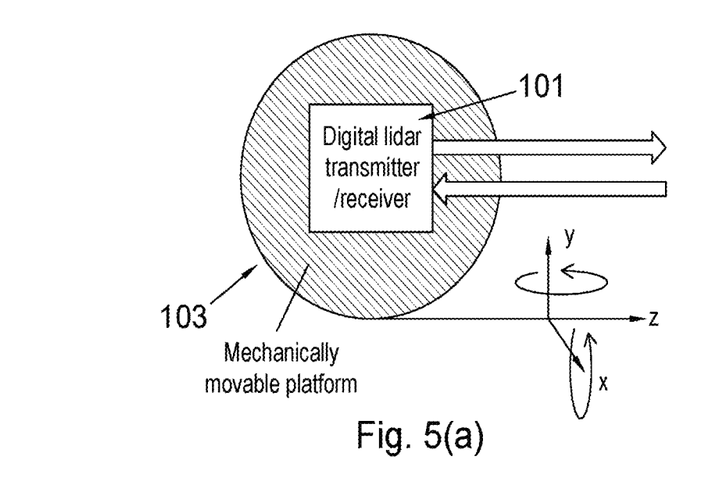
FIGS. 5(a) to 5(d) show variation of how the emitter and receiver may be directed toward different parts of a scene.

In FIG. 5(a) an entire system 101 of the type described with reference to FIG. 1, is mounted on a mechanical movable platform 103. The mounted mechanical moveable platform 103 can tilt the system 101 to direct the transmitter and receiver.

Figure 5B:
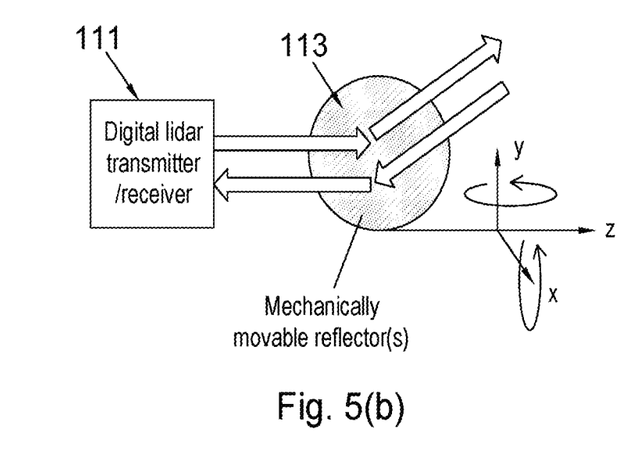

FIG. 5(b) shows a fixed transmitter and receiver 111, and uses a mechanically movable reflector 113 such as a MEMS mirror, to divert the emitted and received signals.

Figure 5C:
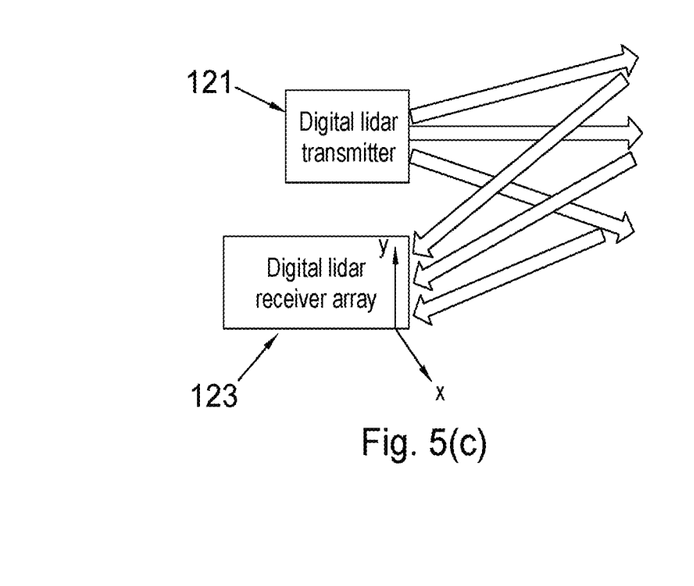

FIG. 5(c) shows a transmitter 121 capable of illuminating a large area, and a receiver array 123 comprising multiple receivers able to resolve the origin of the received light. For example a 2D array of APDs and a lens.

Figure 5D:
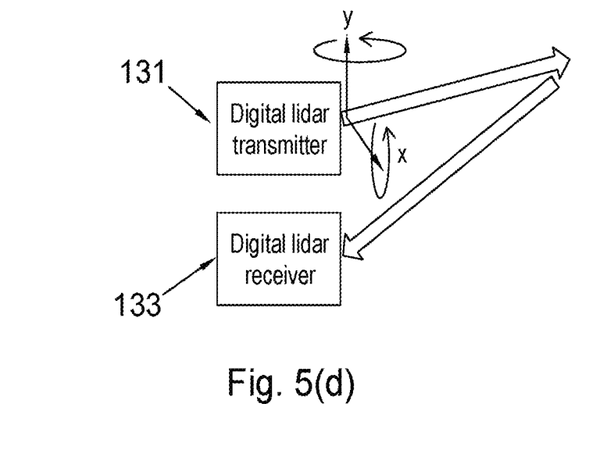

FIG. 5(d) shows a receiver 131 adapted to observing a wide scene, and a transmitter 133 able to emit directed to a desired position. An example of such a transmitter is a phased laser array.

Figure 6:
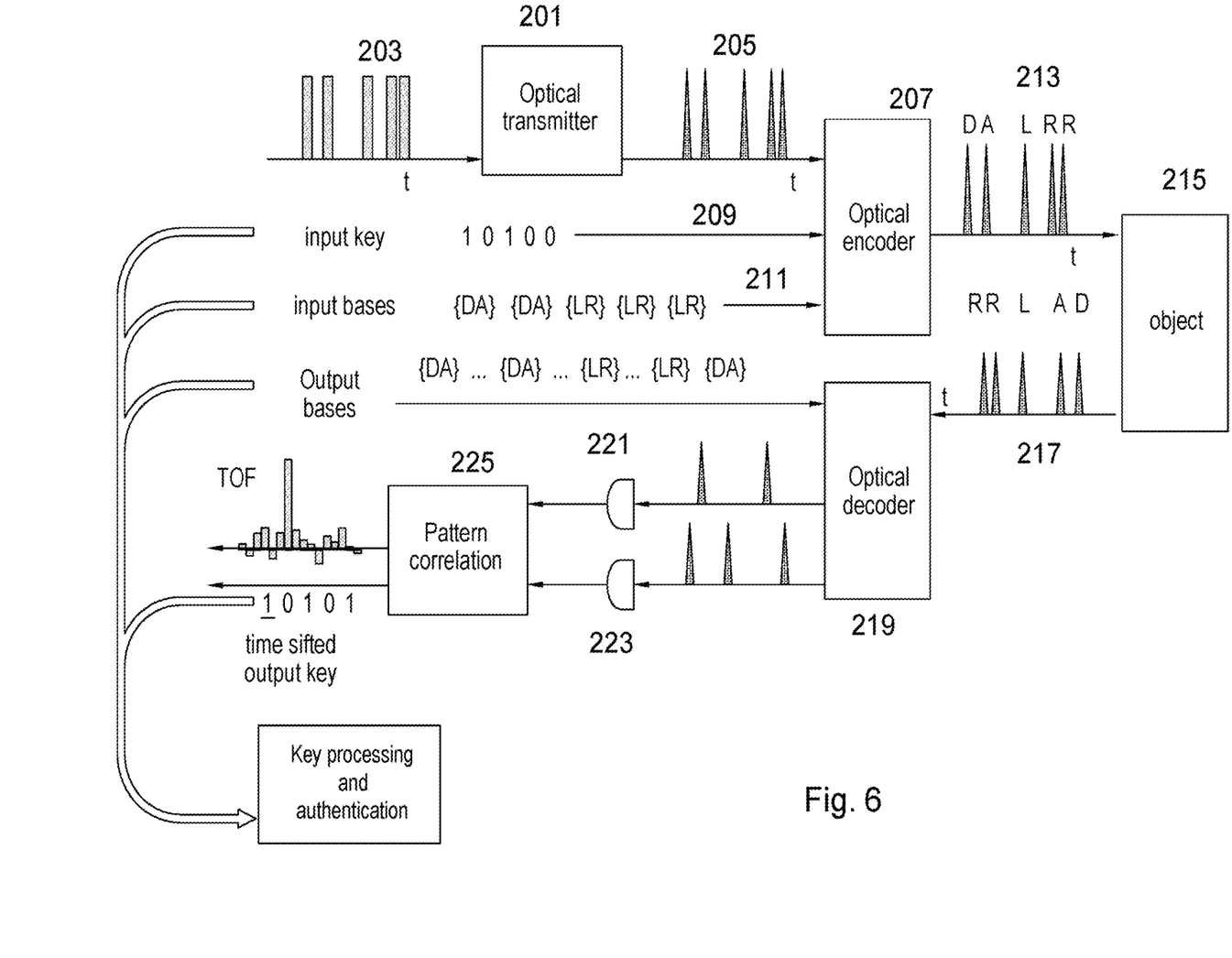
FIG. 6 is a system in accordance with an embodiment with quantum security.

FIG. 6 shows a digital LIDAR system with added quantum security. The principle is that if transmitter powers are used such that the emitted photons per pulse is less than ~1, the attempt to copy a key encoded on the pulse sequence will fail due to the no-cloning theorem, protecting the system against attacks.

In FIG. 6(a) a random input pattern 203 is created in the same way as described in FIG. 1, and sent to the optical transmitter 201 to create an optical pattern 205 of appropriate intensity. The optical pattern 205 is then encoded with quantum information using an optical encoder 207. In this example the optical encoder 207 uses polarisation encoding. A random digital input key 209 and basis sequence 211 is converted to polarisation as shown, where D, A, L and R represent diagonal, anti-diagonal, left and right circularly polarisation states. This procedure is known within the field of QKD. The encoded pattern 213 is then transmitted towards an object/scene 215.

The attenuated reflected pattern 217 is received by an optical decoder 219. This decodes each input pulse in a randomly chosen basis DA or RL, and outputs the 0 and 1 optical pulses to two detectors 221 and 223 respectively. The output from both detectors is then sent to a digital pattern correlator 225 to identify the time delay of the input pattern in the received signals as explained with reference to FIG. 1. This allows a TOF measurement.

To certify the TOF measurement, only the detector outputs at times corresponding to an expected signal photon are retained to create a time sifted output key. In this example, it can be seen that the underlined key value is incorrect as the basis choice for its measurement did not match that of its encoding. Such key values are removed during key processing during a basis reconciliation phase.

Error correction and privacy amplification may be applied to the pattern or sequence of patterns to create a final output key. If the procedure is successful, the LIDAR reflection is certified as authentic and the system is secure.

In a variation of this embodiment, object 215 is removed, and the receiver systems are placed at another location. Examples include ground-based transmitter to aircraft or satellite free space quantum communication systems. The system is therefore operated in transmission mode. In this variation, the shared key can be used to encrypt data transferred between locations. The advantage of the digital correlation component is that it provides a way to synchronise the timing of the received patterns, which is especially important for locations where the distance between them is changing rapidly.

Figure 7:
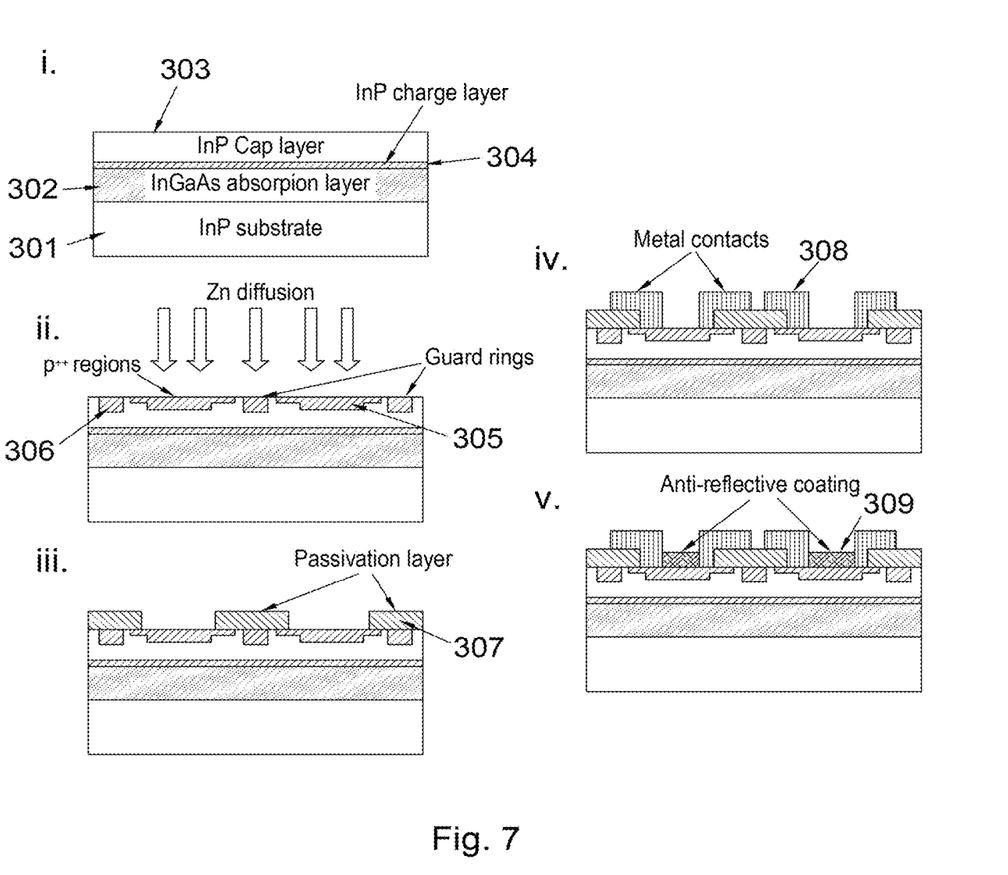
FIG. 7 is a schematic of a receiver that can be used with the systems of the embodiments described herein.

FIG. 7 shows an example of a fabrication sequence for a device that may be used as the receiver. In this example, the receiver is the type of device described for example in GB2551483. For completeness a description of this device is included below.

In this example, the device is an avalanche photodiode which is part of a photon detection device. The device comprises detection regions with an avalanche multiplication region integrated on a semiconductor substrate.

The device may be fabricated from one or more semiconductor materials, depending on the wavelength of the light which it is designed to detect.

Each detection region comprises an avalanche multiplication region. For each detection region, there is a corresponding contact. In this case the contact is an anode contact, however it will be appreciated that this could alternatively be a cathode contact. Each anode contact is connected to a metal contact region 308.

The basis for the heterostructure is a substrate 301, on which the subsequent layer structure is fabricated. The substrate may be an InP substrate for example.

A uniform heterolayer, the second layer 302, is deposited on said substrate 301. The second layer 302 may be an un-doped or lightly doped n-type InGaAs layer for example.

A uniform n+ type heterolayer, the highly doped layer 304, is deposited on said second layer 302. This layer may be a highly doped n-type InP layer for example.

A uniform layer, the first layer 303 is deposited on said highly doped layer 304. The first layer 303 may be un-doped or lightly doped n-type InP for example.

A cross-sectional view of the device at this stage in fabrication is shown in i.

Areas of highly-doped p-type material 305 are incorporated into the first layer 303. The areas may be incorporated by Zn diffusion, or alternatively by gas immersion laser doping or ion implantation for example.

In an embodiment, further areas of highly doped material, forming the guard ring regions 306, are also incorporated into the first layer 303. The guard ring regions may be formed in the same step as the highly doped regions 305, or in a separate step, and by the same method or by a different method.

A cross-sectional view of the device at this stage in fabrication is shown in ii.

In an alternative embodiment, the first 303 and second 302 layers may be silicon, in which p-type and n-type doping may be achieved using Boron or Phosphorous impurities respectively. The device may alternatively be based on a Silicon-Germanium heterostructure or based on any of the III-V class of semiconductors.

In an alternative embodiment, the device comprises highly n-doped regions 305 which are incorporated into a moderately doped n-type heterolayer 303, for example by gas immersion laser doping, implantation or diffusion.

The passivation layer 307 is deposited on the surface of the device, except for a portion of the surface above each highly doped region 305. The passivation layer 307 may be a dielectric, for example silicon nitride or silicon oxide.

A cross-sectional view of the device at this stage in fabrication is shown in iii.

The metal contact region 308 corresponding to each detection region is then deposited on the edge portion of the passivation layer and the outer portion of the inner portion of the highly doped region 305. For example, the metal contact region 308 may be a Chromium/Gold double layer where the highly doped p-type regions are InP. The metal contact region on the opposite surface of the substrate to the fabricated layers may be a different metal or semiconductor.

A cross-sectional view of the device at this stage in fabrication is shown in iv.

An anti-reflective coating 309 may be deposited on the remaining portion of the highly doped regions 305. The material of the anti-reflective coating 309 may depend on the wavelength of light intended for the detector. For example, for an InP based detector, silicon nitride with a selected thickness may be used so that the reflection at the surface is minimal.

A cross-sectional view of the device at this stage in fabrication is shown in v.

In the above example, two detectors are fabricated as there are two exposed portions of highly doped regions 305. However, the fabrication can also be used for just one detector.

In an embodiment, the emitter may be a distributed feedback (DFB) lasers, distributed Bragg reflector (DBR) lasers or ridge lasers.

Figure 8:
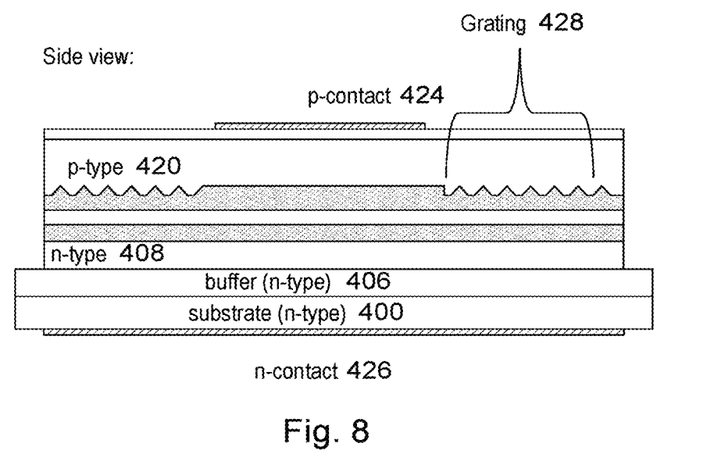
FIG. 8 is a schematic of an emitter that can be used with the systems of the embodiments described herein.

The lasers may comprise a grating region. The grating region may be separate from the active region or the active region may comprise the grating. A laser where the active region and grating are separate is referred to as DBR (distributed Bragg reflector) laser. A DBR is shown in FIG. 8. A laser where the active region comprises the grating is a DFB laser.

A DBR is shown in FIG. 7(a). The active area comprises a multi quantum well region (MQW). The MQW region comprises a plurality of quantum well layers. Where the laser is configured for 1.55 um operation, the MQW region comprises alternating layers of materials such as, for example: AlInGaAs/InP, AlInGaAs/AlInAs, InGaAsP/InP, InGaAsP/AlInAs or InGaAs/AlInGaAs. All these layers are lattice matched to an InP substrate.

The device comprises a substrate 400. On one surface of the substrate is an n-contact 426. Overlying and in contact with the opposite surface to the substrate 400 is the buffer layer 406. Both the substrate 400 and the buffer layer 406 are n-type layers. Alternatively, the structure can be reversed, such that the substrate 400 is a p-type layer. The layers may be n-doped InP. Overlying and in contact with the buffer layer 406 is the n-type layer 408. The n-type layer 408 may be n-doped InP. Overlying and in contact with a strip of the n-type layer 408 is a first waveguide material 410a. Overlying and in contact with the first waveguide material 410a is a MQW layer 412. Overlying and in contact with the MQW layer 410 is a second waveguide material 410b. On either side of the strip and overlying and in contact with the n-type material 408 is a p-type material 416, which may be p-doped InP. The n-type layer 418 is overlying and in contact with the p-type layer 416, and may be n-doped InP. The p-type layer 420 is overlying and in contact with the second waveguide layer 410b and the n-type layer 418, and may be p-doped InP. A p-type contact layer 422 is overlying and in contact with the p-type layer 420. In one embodiment, the p-type contact layer 422 is heavily doped InP, i.e. having a dopant concentration higher than that of layer 420. A p-contact metal 424 is overlying and in contact with part of the p-contact layer 422.

As shown in the side view in FIG. 8 the MQW strip runs along the length of the device. There is a first p-type contact layer 424 over part of the MQW strip. On either side of the part of the strip under the first p-contact 424 along the direction in which light is emitted, there is a diffraction grating in the second waveguide material.

A current is applied between the first p-contact 424 and the n-contact 426 in order to generate light in the MQW strip of the coherent light source 20. Light generated in the MQW strip of the laser is emitted along the MQW layer. The light is laterally confined by the p-type layer 416 and vertically confined by the waveguide layers 410a and b. The light exits the MQW layer through an aperture of the laser; the apertures are described below.

Whilst certain embodiments have been described, these embodiments have been presented by way of example only, and are not intended to limit the scope of the inventions. Indeed, the novel systems and methods described herein may be embodied in a variety of other forms; furthermore, various omissions, substitutions and changes in the form of the system and methods described herein may be made without departing from the spirit of the inventions. The accompanying claims and their equivalents are intended to cover such forms or modifications as would fall within the scope and spirit of the inventions.

The invention claimed is:

1. An investigative system, comprising:
   an emitter configured to output a plurality of pulses, said plurality of pulses being arranged in a first temporal pattern;
   a receiver configured to receive said plurality of pulses and generate a digital output pattern, wherein the digital output pattern is binary and includes a uniform positive output when a photon or photons are detected; and
   a correlator configured to correlate the first temporal pattern with the digital output pattern to output a correlated pattern.

2. The system according to claim 1, wherein the receiver is a single photon avalanche photodiode.

3. The system according to claim 1, wherein the first temporal pattern is a pattern that avoids repeating cycles within the first temporal pattern.

4. The system according to claim 1, wherein
   the emitter and receiver are arranged such that the receiver detects pulses that are reflected from an object, and
   the correlator is configured to extract a time of flight of the plurality of pulses from the correlated pattern.

5. The system according to claim 4, wherein the system is configured as a LIDAR system by using the time of flight to determine the position of the object.

6. The system according to claim 5, wherein the system further comprises a steering mechanism to steer the plurality of pulses to allow an object to be spatially scanned.

7. The system according to claim 4, wherein
   the system further comprises an array of emitters each configured to emit a plurality of pulses with different temporal patterns, and
   the correlator is configured to correlate each of the different temporal patterns with the digital output pattern.

8. The system according to claim 1, wherein a width of each pulse of the plurality of pulses is between 10-1000 ps.

9. The system according to claim 1, wherein a minimum separation between pulses is 10-1000 ps.

10. The system according to claim 1, wherein the correlator is configured to correlate the first temporal pattern with the digital output pattern using a digital phase correlation.

11. The system according to claim 1, wherein the first temporal pattern is varied over time.

12. The system according to claim 1, wherein
    the system is configured to make plurality of investigations, and
    the emitter is configured to emit a plurality of pulses for each of the investigations, the first temporal pattern changing for each of the investigations.

13. The system according to claim 1, wherein the emitter and the receiver are mounted on a mechanical movable platform.

14. The system according to claim 1, further comprising a moveable reflector, wherein said reflector is positioned to direct the plurality of pulses to an object and direct pulses reflected from the object to the receiver, the reflector being moveable to allow the object to be scanned.

15. The system according to claim 1, wherein
    said emitter is configured to emit a wide beam, and
    the receiver comprises an array of receivers.

16. The system according to claim 1, wherein
    the emitter is a directable emitter, and
    the receiver is configured to receive signals from a wide area.

17. The system according to claim 1, further comprising an encoder, wherein
    said encoder is configured to encode said plurality of pulses with quantum information, and
    the system further comprises a decoder configured to decode said quantum information.

18. The system according to claim 17, wherein
    the correlator is configured to determine a time of flight of said pulses from said correlation, and
    the system is further configured to identify the pulses for decoding using the time of flight.

19. The system according to claim 17, wherein the encoder is configured to encode the quantum information on said pulses by encoding said pulses using polarisation or phase.

20. A method of investigating a scene, the method comprising:
    emitting a plurality of pulses, said plurality of pulses being arranged in a first temporal pattern;
    receiving said plurality of pulses including generating a digital output pattern, wherein the digital output pattern is binary and includes a uniform positive output when a photon or photons are detected; and
    correlating the first pattern with the digital output pattern to output a correlated pattern.

* * * * *